(12) United States Patent
Choi et al.

(10) Patent No.: US 10,566,808 B2
(45) Date of Patent: Feb. 18, 2020

(54) SYSTEM AND METHOD FOR DIAGNOSING BATTERY CONNECTION STATUS

(71) Applicants: Hyundai Motor Company, Seoul (KR); Kia Motors Corporation, Seoul (KR)

(72) Inventors: Won Kyoung Choi, Gyeonggi-Do (KR); Na Lae Kwon, Seoul (KR); Jee Heon Kim, Gyeonggi-Do (KR); Dong Jun Lee, Gyeonggi-do (KR); Ho Joong Lee, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 28 days.

(21) Appl. No.: 15/809,858

(22) Filed: Nov. 10, 2017

(65) Prior Publication Data

US 2018/0358825 A1    Dec. 13, 2018

(30) Foreign Application Priority Data

Jun. 7, 2017  (KR) .......................... 10-2017-0070914

(51) Int. Cl.
| | |
|---|---|
| *H02J 7/00* | (2006.01) |
| *G01R 31/04* | (2006.01) |
| *G01R 19/165* | (2006.01) |
| *H02J 7/34* | (2006.01) |
| *G01R 31/36* | (2019.01) |

(52) U.S. Cl.
CPC ...... *H02J 7/0036* (2013.01); *G01R 19/16542* (2013.01); *G01R 31/04* (2013.01); *G01R 31/3644* (2013.01); *H02J 7/0047* (2013.01); *H02J 7/0068* (2013.01); *H02J 7/34* (2013.01)

(58) Field of Classification Search
CPC ............... H02J 7/0031; H02J 2007/004; H02J 2007/0037; Y02E 60/12; H01M 10/48
USPC ........................................................ 320/134
See application file for complete search history.

(56) References Cited

U.S. PATENT DOCUMENTS

| | | | |
|---|---|---|---|
| 5,587,916 A * | 12/1996 | Martinson ........ | G01R 19/16542 323/224 |
| 5,821,734 A * | 10/1998 | Faulk .................... | H01M 10/46 320/124 |
| 5,936,383 A * | 8/1999 | Ng ........................ | G01R 31/396 320/132 |

(Continued)

FOREIGN PATENT DOCUMENTS

KR    10-1425634    10/2014

*Primary Examiner* — Arun C Williams
(74) *Attorney, Agent, or Firm* — Mintz Levin Cohn Ferris Glovsky and Popeo, P.C.; Peter F. Corless

(57) ABSTRACT

A system for diagnosing a battery connection status includes: a DC-DC converter that converts and outputs a level of an input voltage; a battery connected to an output terminal of the DC-DC converter; and a controller that generates a control value for compensating for an error between a voltage command or a current command of the battery and a detection voltage or a detection current of the battery, controls the output of the DC-DC converter by applying the control value, and diagnoses a connection status between the DC-DC converter and the battery based on a change in error between the detection voltage or the detection current of the battery and the voltage command or the current command of the battery.

6 Claims, 4 Drawing Sheets

(56) References Cited

U.S. PATENT DOCUMENTS

| | | | | |
|---|---|---|---|---|
| 2001/0050547 A1* | 12/2001 | Takimoto | ............... | H02J 7/022 |
| | | | | 323/284 |
| 2007/0096693 A1* | 5/2007 | Palczynski, Jr. | ...... | H02J 7/0065 |
| | | | | 320/128 |
| 2007/0108943 A1* | 5/2007 | Kobayashi | ............ | H02J 7/0054 |
| | | | | 320/128 |
| 2007/0188134 A1* | 8/2007 | Hussain | ............... | H01M 10/44 |
| | | | | 320/114 |
| 2007/0212596 A1* | 9/2007 | Nebrigic | .............. | H01M 10/42 |
| | | | | 429/61 |
| 2011/0313613 A1* | 12/2011 | Kawahara | ........... | H01M 10/441 |
| | | | | 701/34.4 |
| 2015/0288201 A1* | 10/2015 | Hatakeyama | ......... | B60L 3/0069 |
| | | | | 320/107 |

\* cited by examiner

SYSTEM AND METHOD FOR DIAGNOSING BATTERY CONNECTION STATUS

CROSS REFERENCE TO RELATED APPLICATION

The present application claims under 35 U. S.C. § 119(a) the benefit of Korean Patent Application No. 10-2017-0070914, filed on Jun. 7, 2017, the entire contents of which are incorporated by reference herein.

BACKGROUND

1. Technical Field

The present disclosure relates to a system and method for diagnosing a battery connection status, and more particularly, to a system and method for accurately diagnosing a battery connection status between a DC-DC converter and a battery based on a change in error between a voltage or current of the battery and a voltage command or current command of the battery.

2. Description of the Related Art

In eco-friendly vehicles using energy of high voltage batteries, power is supplied to electric field loads and an auxiliary (also referred to as "low voltage") battery through a low-voltage DC-DC converter (LDC) that converts high voltage into low voltage. The auxiliary battery is used as an auxiliary power source by supplying stored energy to the electric field loads when the LDC is not operated or when the electric field load of the vehicle temporarily uses a large amount of energy. For example, the LDC and the auxiliary battery are connected to each other by connection media such as a cable and a bus bar.

The connection medium electrically connecting between the LDC and the auxiliary battery has its own resistance, and the fastening between the respective single items by a bolt or the like generates resistance by itself.

Conventionally, in order to diagnose the connection status between the LDC and the auxiliary battery, an output voltage of the LDC is fluctuated to compare a voltage difference between terminals of the auxiliary battery to diagnose the connection status. In this case, however, it is difficult to accurately diagnose a connection status because the voltage difference between the terminals of the auxiliary battery may change in response to the change in resistance (for example, a change in temperature and deterioration state in the connection terminal) between the LDC and the auxiliary battery.

Therefore, since various parameters are needed to diagnose the cable connection status by the voltage fluctuation method, the diagnosis range may be limited and inaccurate.

The contents described as the related art have been provided only for assisting in the understanding for the background of the present disclosure and should not be considered as corresponding to the related art known to those skilled in the art.

SUMMARY

An object of the present disclosure is to provide a system and method for accurately diagnosing a battery connection status between a DC-DC converter and a battery based on a change in error between a voltage or current of a battery and a voltage command or current command of the battery.

According to an exemplary embodiment of the present disclosure, there is provided a system for diagnosing a battery connection status, including: a DC-DC converter configured to convert and output a level of an input voltage; a battery configured to be connected to an output terminal of the DC-DC converter; and a controller configured to generate a control value for compensating for an error between a voltage command or a current command of the battery and a detection voltage or a detection current of the battery, control the output of the DC-DC converter by applying the control value, and diagnose a connection status between the DC-DC converter and the battery based on a change in error between the detection voltage or the detection current of the battery and the voltage command or the current command of the battery.

The controller may include: a battery manager configured to monitor the detection voltage or the detection current of the battery; and a DC-DC conversion controller configured to receive the detection voltage or the detection current from the battery manager, generate the control value for compensating for the error between the voltage command or the current command of the battery and the detection voltage or the detection current of the battery, control the output of the DC-DC converter by applying the control value, and diagnose the connection status between the DC-DC converter and the battery based on a change in error between the detection voltage or the detection current of the battery and the voltage command or the current command of the battery.

The DC-DC conversion controller may include: a first error compensation controller configured to generate the control value for compensating for the error between the voltage command or the current command of the battery and the detection voltage or the detection current of the battery; and a second error compensation controller configured to control an operation of the DC-DC converter to compensate for an error between a summed value obtained by summing the control value generated from the first error compensation controller and the voltage command of the DC-DC converter and an output voltage detection value of the DC-DC converter.

The second error compensation controller may generate a pulse width modulation signal controlling the operation of the DC-DC converter to compensate for an error between a voltage command compensation value of the DC-DC converter and the output voltage detection value of the DC-DC converter.

According to another exemplary embodiment of the present disclosure, there is provided a method for diagnosing a battery connection status for diagnosing a connection status between a DC-DC converter converting and outputting a level of an input voltage and an output terminal of the DC-DC converter, the method including: generating, by a controller, a control value for compensating for an error between a voltage command or a current command of a battery and a detection voltage or a detection current of the battery; controlling, by the controller, an output of the DC-DC converter by applying the control value; and diagnosing, by the controller, a connection status between the DC-DC converter and the battery based on a change in error between the detection voltage or the detection current of the battery and the voltage command or the current command of the battery.

The controller may include: a battery manager configured to monitor the detection voltage or the detection current of the battery; and a DC-DC conversion controller configured to receive the detection voltage or the detection current from the battery manager, generate the control value for compensating for the error between the voltage command or the current command of the battery and the detection voltage or the detection current of the battery, control the output of the DC-DC converter by applying the control value, and diagnose the connection status between the DC-DC converter and the battery based on a change in error between the detection voltage or the detection current of the battery and the voltage command or the current command of the battery.

In the controlling of the output, an operation of the DC-DC converter may be controlled to compensate for an error between a summed value obtained by summing the control value and the voltage command of the DC-DC converter and an output voltage detection value of the DC-DC converter.

In the controlling of the output, a pulse width modulation signal controlling the operation of the DC-DC converter may be generated to compensate for an error between a voltage command compensation value of the DC-DC converter and the output voltage detection value of the DC-DC converter.

A non-transitory computer readable medium containing program instructions executed by a processor can include: program instructions that generate a control value for compensating for an error between a voltage command or a current command of a battery and a detection voltage or a detection current of the battery; program instructions that control an output of a DC-DC converter by applying the control value; and program instructions that diagnose a connection status between the DC-DC converter and the battery based on a change in error between the detection voltage or the detection current of the battery and the voltage command or the current command of the battery.

DESCRIPTION OF THE EXEMPLARY EMBODIMENTS

Figure 1:
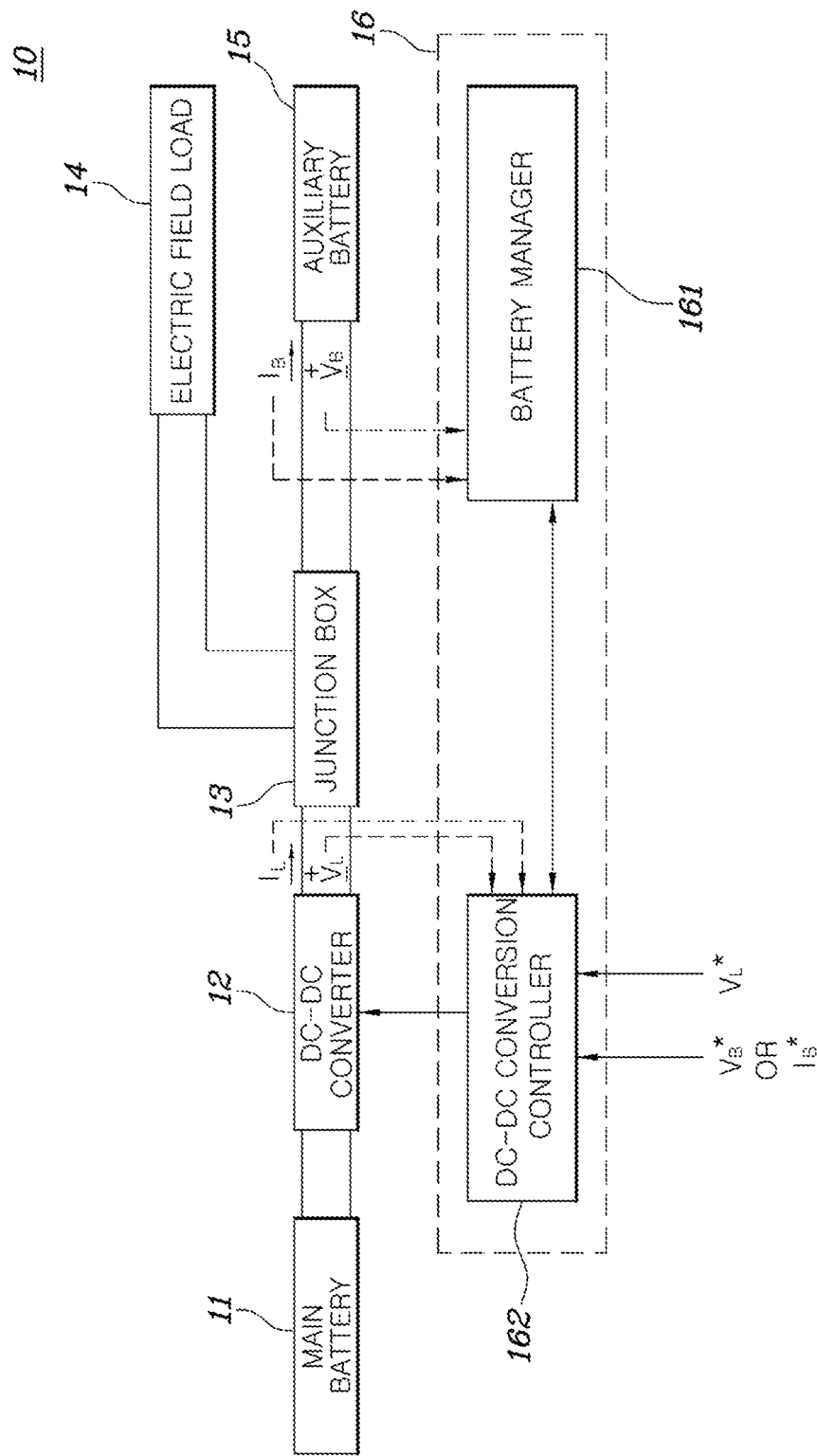
FIG. 1 is a block diagram illustrating a system for diagnosing a battery connection status according to an embodiment of the present disclosure.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Further, the control logic of the present disclosure may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

Hereinafter, a system and method for diagnosing a battery connection status according to various embodiments of the present disclosure will be described in detail with reference to the accompanying drawings. In particular, in the following description, a system and method for diagnosing a battery connection status between a DC-DC converter and a battery in a vehicle will be described as an example of the present disclosure.

FIG. 1 is a block diagram illustrating a system for diagnosing a battery connection status according to an embodiment of the present disclosure.

Referring to FIG. 1, a system 10 for diagnosing a battery connection status includes a DC-DC converter 12, an auxiliary battery 15, and a controller 16.

The DC-DC converter 12 converts and outputs an input voltage.

For example, the DC-DC converter 12 may be provided between a main battery 11 (also referred to as a "high voltage battery") and a junction box 13 to convert a level of a DC voltage input from the main battery 11 and provide the converted DC voltage to an electric field load 14 and the auxiliary battery 15 through the junction box 13.

In particular, the junction box 13 forms an electrical connection between the DC-DC converter 12 and various elements supplied with output power of the DC-DC converter 12. An output terminal of the DC-DC converter 12 may be electrically connected to the electric field load 14, the auxiliary battery 15 or the like through the junction box 13.

The electric field load 14 can be, for example, a hot wire, a radio, a black box, and/or externally mounted components. The electric field load 14 may be operated by being supplied with a power voltage from the DC-DC converter 12 or the auxiliary battery 15. For example, if the DC-DC converter 12 is not operated, the electric field load 14 may be operated by being supplied with the power voltage from the auxiliary battery 15.

The auxiliary battery 15 is arranged to provide power for operating the electric field load 14 operated at a low voltage. The auxiliary battery 15 is connected to the junction box and may be charged with the DC power supplied from the DC-DC converter 12.

As illustrated in FIG. 1, the DC-DC converter 12 and the auxiliary battery 15 may be connected to each other by connection media such as a cable through the junction box 13. However, if the fastened state of the cable is poor, that is, disconnected, the auxiliary battery 15 may not be charged.

In this state, if the DC-DC converter 12 fails, the electric field load 14 is operated only with the energy stored in the auxiliary battery 15, such that the auxiliary battery 15 may overdischarge. As a result, serious safety problems such as a shutdown of a power supply of a vehicle may occur.

In addition, the cable connecting between the DC-DC converter 12 and the auxiliary battery 15 has its own resistance. Due to the resistance of the cable itself, the voltage output from the DC-DC converter 12 is transmitted to the auxiliary battery 15 while being partially lost, such that the voltage or the current of the auxiliary battery may not reach a predetermined voltage command or current command.

In consideration of these problems, the present disclosure provides a technique for more efficiently diagnosing a battery connection status between the DC-DC converter 12 and the auxiliary battery 15 by using the controller 16.

The controller 16 controls the DC-DC converter 12 to follow up a voltage command $V_B^*$ or a current command $I_B^*$ of the arbitrarily set auxiliary battery 15. The controller 16 determines the battery connection status based on the control result, that is, a detection voltage $V_B$ or a detection current $I_B$ of the auxiliary battery 15 and the voltage command $V_B^*$ or the current command $I_B^*$ of the battery 15 used for the control.

In particular, the controller 16 may generate a control value for compensating for an error between the voltage command $V_B^*$ or the current command $I_B^*$ of the auxiliary battery 15 and the detection voltage $V_B$ or the detection current $I_B$ of the auxiliary battery 15. The control value is a value that is applied to the voltage command of the DC-DC converter 12 later.

Next, the controller 16 may generate the voltage command of the DC-DC converter 12 by applying the generated control value, and control the DC-DC converter 12 to output a voltage corresponding to the voltage command reflecting the applied control value.

Next, the controller 16 may diagnose the connection status between the DC-DC converter 12 and the auxiliary battery 15 based on the change in error between the voltage command $V_B^*$ or the current command $I_B^*$ of the auxiliary battery 15 and the detection voltage $V_B$ or the detection current $I_B$ of the auxiliary battery 15.

For example, as illustrated in FIG. 1, the controller 16 may include a battery manager 161 and a DC-DC conversion controller 162.

The battery management unit 161 may receive and monitor the detection voltage $V_B$ or the detection current $I_B$ of the auxiliary battery 15 from the auxiliary battery 15. In particular, the battery management unit 161 may receive and store various battery status information including the detection voltage $V_B$ or the detection current $I_B$ of the auxiliary battery 15. For example, the battery status information refers to various status information including a charge amount, a temperature or the like of the battery.

As described above, the DC-DC conversion controller 162 may perform a process of generating a control value based on the detection voltage $V_B$ or the detection current $I_B$ of the auxiliary battery 15 and the voltage command $V_B^*$ or the current command $I_B^*$ of the auxiliary battery 15, a process of generating a voltage command of the DC-DC conversion controller 162 by applying the control value, a process of controlling the DC-DC conversion controller 162 to follow up the voltage command reflecting the control value, and a process of diagnosing the battery connection status based on the error between the detection voltage $V_B$ or the detection current $I_B$ of the auxiliary battery 15 and the voltage command $V_B^*$ or the current command $I_B^*$ of the auxiliary battery 15.

Figure 2:
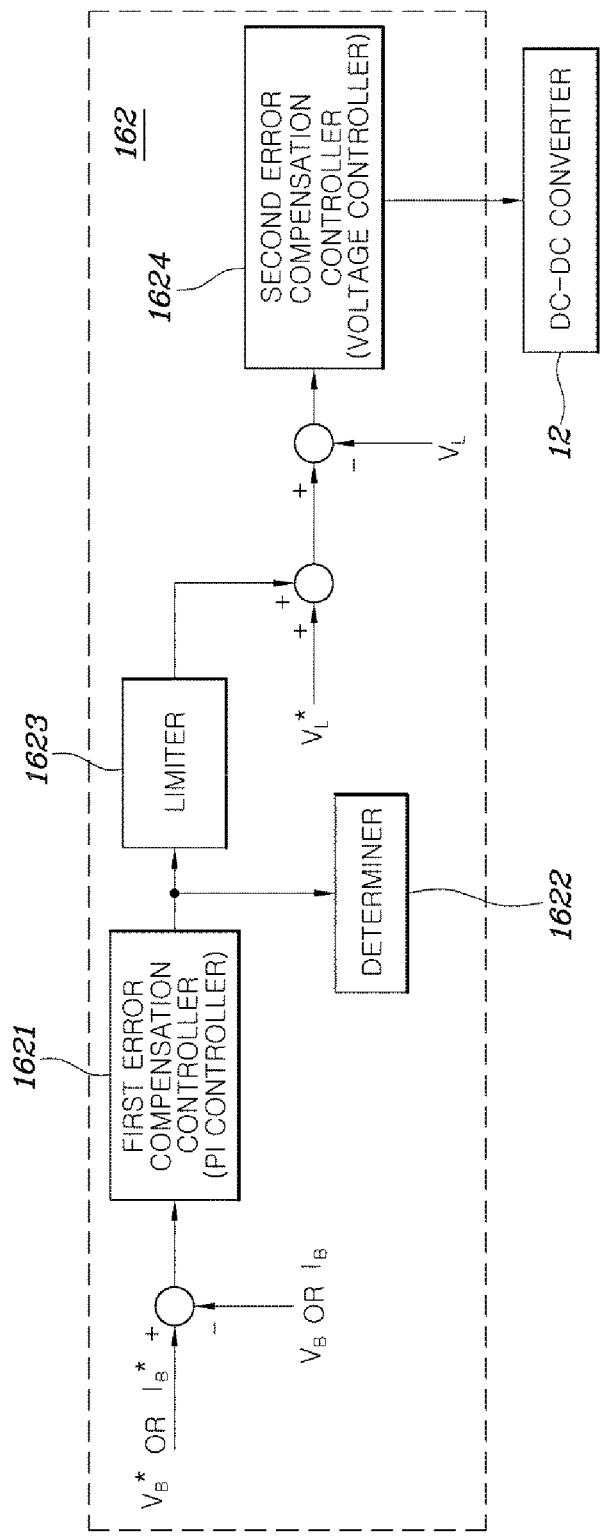
FIG. 2 is a block diagram illustrating an example of a DC-DC conversion controller included in a controller of the system for diagnosing the battery connection status according to the embodiment of the present disclosure.

FIG. 2 is a block diagram illustrating an example of a DC-DC conversion controller included in a controller of a system for diagnosing a battery connection status according to an embodiment of the present disclosure.

Referring to FIG. 2, the DC-DC conversion controller 162 may include a first error compensation controller 1621, a determiner 1622, a limiter 1623, and a second error compensation controller 1624.

In particular, the first error compensation controller 1621 may generate the control value for compensating for the error between the voltage command $V_B^*$ or the current command $I_B^*$ of the auxiliary battery 15 and the detection voltage $V_B$ or the detection current $I_B$ of the auxiliary battery 15.

For example, the first error compensation controller 1621 may be implemented as a proportional integral (PI) controller. The first error compensation controller 1621 may receive the error between the voltage command $V_B^*$ or the current command $I_B^*$ of the auxiliary battery 15 and the detection voltage $V_B$ or the detection current $I_B$ of the auxiliary battery 15 and output a control value capable of reducing the error by applying a PI control to the error.

The determiner 1622 may diagnose the connection status between the DC-DC converter 12 and the auxiliary battery 15 based on the control value for compensating for the error between the voltage command $V_B^*$ or the current command $I_B^*$ of the auxiliary battery 15 and the detection voltage $V_B$ or the detection current $I_B$ of the auxiliary battery 15 that are input to the first error compensation controller 1621.

In particular, the determiner 1622 may be selectively provided on a front side or a rear side of the first error compensation controller 1621 to perform a control applying the voltage command $V_B^*$ or the current command $I_B^*$ of the auxiliary battery 15 and may then determine the connection status of the auxiliary battery 15 based on the change in error between the voltage command $V_B^*$ or the current command $I_B^*$ of the auxiliary battery 15 and the detection voltage $V_B$ or the detection current $I_B$ of the auxiliary battery 15. For example, if the error value between the voltage command $V_B^*$ or the current command $I_B^*$ of the auxiliary battery 15 and the detection voltage $V_B$ or the detection current $I_B$ of the auxiliary battery 15 that are input to the first error compensation controller 1621 is substantially 0 or the control value output from the first error compensation controller 1621 is substantially 0, it may be diagnosed that the connection status between DC-DC converter 12 and the auxiliary battery 15 is good. On the other hand, if the error value between the voltage command $V_B^*$ or the current command $I_B^*$ of the auxiliary battery 15 and the detection voltage $V_B$ or the detection current $I_B$ of the auxiliary battery 15 that are input to the first error compensation controller 1621 is not changed or the control value output from the first error compensation controller 1621 is larger than the previous control value, it may be diagnosed that the connection status between DC-DC converter 12 and the auxiliary battery 15 is poor.

The limiter 1623 may be selectively provided to limit the control value of the auxiliary battery 15 generated from the first error compensation controller 1621 from rising to infinity.

The DC-DC conversion controller 162 may generate a summed value obtained by summing the control value generated from the first error compensation controller 1621 and a voltage command $V_L^*$ of the DC-DC converter 12, that is, a voltage command compensation value for the DC-DC converter 12.

The second error compensation controller 1624 may control an operation of the DC-DC converter 12 to compensate for an error between the summed value obtained by summing the control value generated from the first error compensation controller 1621 and the voltage command $V_L^*$ for the DC-DC converter 12 and an output voltage detection value $V_L$ of the DC-DC converter 12.

The second error compensation controller 1624 may generate a pulse width modulation (PWM) signal for operating the DC-DC converter 12 so that the output voltage detection value $V_L$ of the DC-DC converter 12 follows up the voltage command compensation value.

Figure 3:
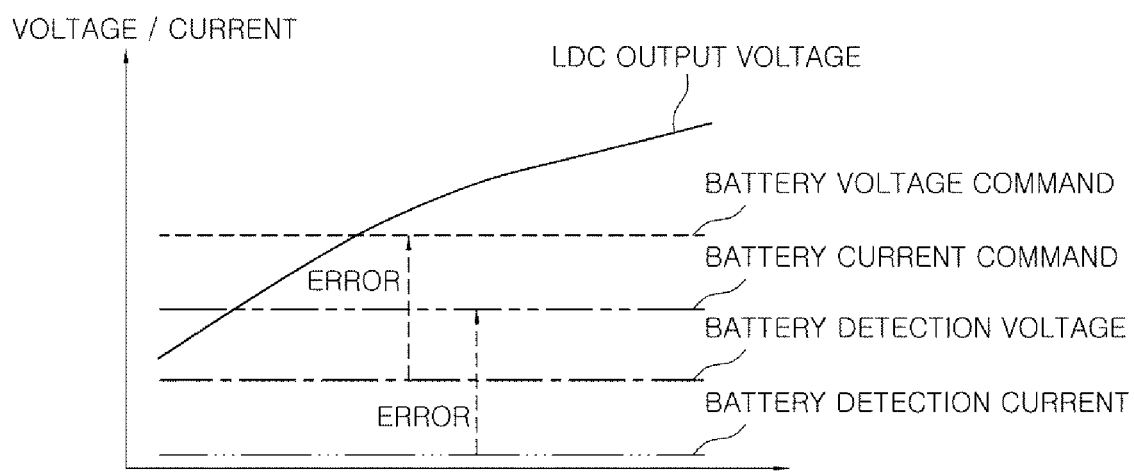
FIG. 3 is a diagram for explaining a technique for diagnosing a battery connection status between the DC-DC converter and the battery using the system for diagnosing the battery connection status according to the embodiment of the present disclosure.

FIG. 3 is a diagram for explaining a technique for diagnosing a battery connection status between the DC-DC converter and the battery using the system for diagnosing a battery connection status according to the embodiment of the present disclosure.

As illustrated in FIG. 3, the system 10 for diagnosing a battery connection status according to the embodiment of the present disclosure may set the detection voltage $V_B$ or the detection current $I_B$ of the auxiliary battery 15 and the voltage command $V_B^*$ or the current command $I_B^*$ of the auxiliary battery 15 and determine that the connection status of the auxiliary battery 15 is poor if the error is kept without being corrected in the course of performing the control.

First, the case where the diagnosis is performed based on the detection voltage $V_B$ and the voltage command $V_L^*$ of the auxiliary battery 15 input from the battery management unit 161 will be described. When the voltage command $V_B^*$ of the auxiliary battery 15 having a larger value than the detection voltage $V_B$ of the auxiliary battery 15 is set, if the electrical connection status between the auxiliary battery 15 and the DC-DC converter 12 is good, the error between the voltage command $V_B^*$ of the auxiliary battery 15 and the detection voltage $V_B$ of the auxiliary battery 15 may be gradually reduced to be almost zero. In contrast, if the electrical connection status between the auxiliary battery 15 and the DC-DC converter 12 is poor, the initial error may remain unchanged or the reduction in error may be insignificant. In particular, since the error continues to be maintained, the output voltage of the DC-DC converter 12 continues to rise for error compensation but the detection current of the auxiliary battery 15 is not changed.

Next, the case where the diagnosis is performed based on the detection current $I_B$ of the auxiliary battery 15 input from the battery management unit 161 will be described by way of example. When the current command $V_B^*$ of the auxiliary battery 15 having a larger value than the detection current of the auxiliary battery 15 is set, if the electrical connection status between the auxiliary battery 15 and the DC-DC converter 12 is good, the error between the current command $I_B^*$ of the auxiliary battery 15 and the detection current $I_B$ of the auxiliary battery 15 may be gradually reduced to be almost zero. In contrast, if the electrical connection status between the auxiliary battery 15 and the DC-DC converter 12 is poor, the initial error may remain unchanged or the reduction in error may be insignificant. In particular, since the error continues to be maintained, the output voltage of the DC-DC converter 12 continues to rise for error compensation but the detection voltage of the auxiliary battery 15 is not changed.

Figure 4:
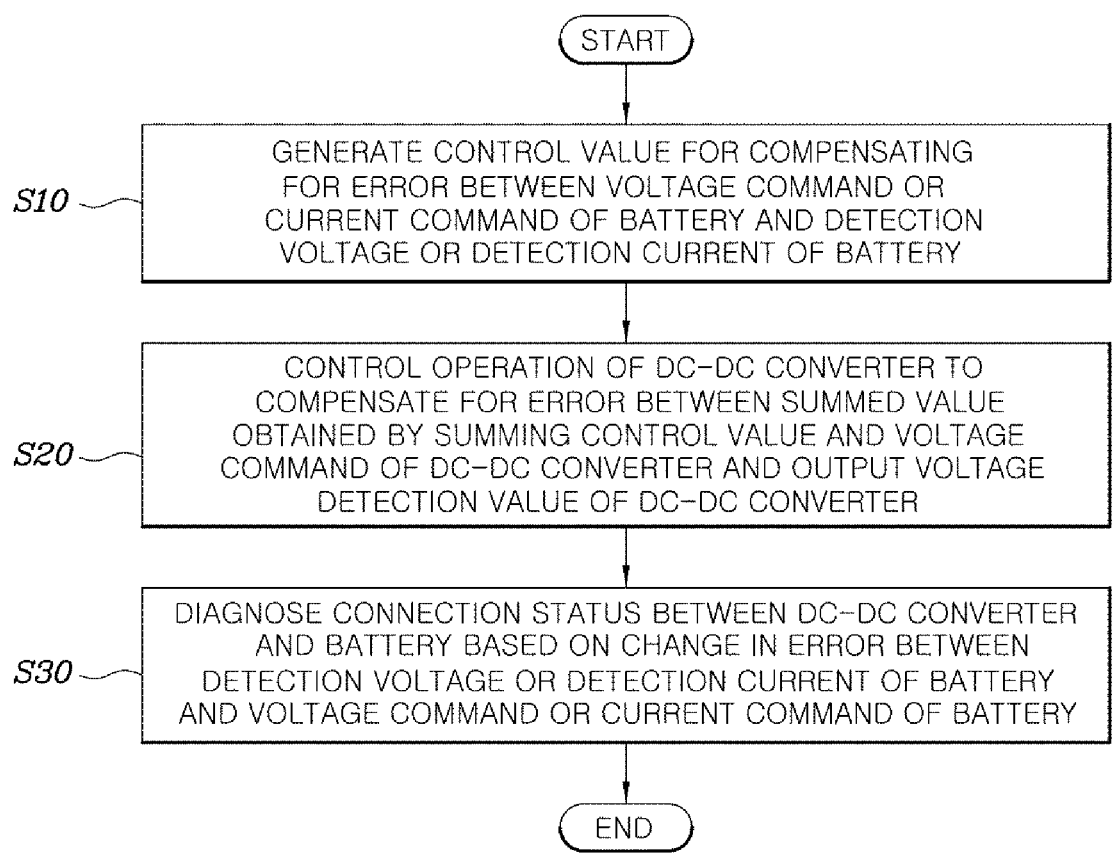
FIG. 4 is a flowchart illustrating a method for diagnosing a battery connection status according to an embodiment of the present disclosure.

FIG. 4 is a flowchart illustrating a method for diagnosing a battery connection status according to an embodiment of the present disclosure.

The method for diagnosing a battery connection status according to the embodiment of the present disclosure is performed by the controller 16 of the system 10 for diagnosing a battery connection status according to the embodiment of the present disclosure, which is described in detail with reference to FIGS. 1 to 3. Accordingly, the method of diagnosing a battery connection status will be briefly described with reference to FIG. 4 according the flow thereof, and specific operations and examples thereof will be replaced with the above description.

Referring to FIG. 4, first, the controller 16 may generate the control value for compensating for the error between the voltage command $V_B^*$ or the current command $I_B^*$ of the auxiliary battery 15 and the detection voltage $V_B$ or the detection current $I_B$ of the auxiliary battery 15 (S10).

Thereafter, the controller 16 controls the operation of the DC-DC converter 12 to compensate for the error between the summed value obtained by summing the control value for compensating for the error between the voltage command $V_B^*$ or the current command $I_B^*$ of the auxiliary battery 15 and the detection voltage $V_B$ or the detection current $I_B$ of the auxiliary battery 15 and the voltage command $V_L^*$ of the DC-DC converter 12 and the output voltage detection value $V_L$ of the DC-DC converter 12.

Next, the controller 16 may generate the connection status between the DC-DC converter 12 and the auxiliary battery 15 based on the control value for compensating for the error between the voltage command $V_B^*$ or the current command $I_B^*$ of the auxiliary battery 15 and the detection voltage $V_B$ or the detection current $I_B$ of the auxiliary battery 15.

As described above, according to the embodiment of the present disclosure, it is possible to more improve the accuracy of the diagnosis by diagnosing the connection status between the DC-DC converter and the battery based on the change in error between the voltage or current of the battery and the voltage command or the current command of the battery without adding the separate circuit for diagnosing the connection status.

In particular, it is possible to improve the driving safety of the vehicle by accurately diagnosing the connection status between the DC-DC converter and the battery when the system and method for diagnosing the battery connection status are applied to the vehicle.

Although the present disclosure has been shown and described with respect to specific exemplary embodiments, it will be obvious to those skilled in the art that the present disclosure may be variously modified and altered without departing from the spirit and scope of the present disclosure as defined by the following claims.

What is claimed is:

1. A system for diagnosing a battery connection status, comprising:
   a DC-DC converter configured to convert and output a level of an input voltage;

a battery configured to be connected to an output terminal of the DC-DC converter; and a controller configured to generate a control value for compensating for an error between a voltage command or a current command of the battery and a detection voltage or a detection current of the battery, control the output of the DC-DC converter by applying the control value, and diagnose an electrical connection status between the DC-DC converter and the battery based on a change in error between the detection voltage or the detection current of the battery and the voltage command or the current command of the battery, wherein the controller includes:

a battery manager configured to monitor the detection voltage or the detection current of the battery; and a DC-DC conversion controller configured to receive the detection voltage or the detection current from the battery manager, generate the control value for compensating for the error between the voltage command or the current command of the battery and the detection voltage or the detection current of the battery, control the output of the DC-DC converter by applying the control value, and diagnose the connection status between the DC-DC converter and the battery based on a change in error between the detection voltage or the detection current of the battery and the voltage command or the current command of the battery, and wherein the DC-DC conversion controller includes:

a first error compensation controller configured to generate the control value for compensating for the error between the voltage command or the current command of the battery and the detection voltage or the detection current of the battery; and a second error compensation controller configured to control an operation of the DC-DC converter to compensate for an error between a summed value obtained by summing the control value generated from the first error compensation controller and the voltage command of the DC-DC converter and an output voltage detection value of the DC-DC converter.

2. The system of claim 1, wherein the second error compensation controller generates a pulse width modulation signal controlling the operation of the DC-DC converter to compensate for an error between a voltage command compensation value of the DC-DC converter and the output voltage detection value of the DC-DC converter.

3. A method for diagnosing an electrical connection status between a DC-DC converter converting and outputting a level of an input voltage and a battery electrically connected to an output terminal of the DC-DC converter, the method comprising:

generating, by a controller, a control value for compensating for an error between a voltage command or a current command of the battery and a detection voltage or a detection current of the battery;

controlling, by the controller, an output of the DC-DC converter by applying the control value; and diagnosing, by the controller, the electrical connection status between the DC-DC converter and the battery based on a change in error between the detection voltage or the detection current of the battery and the voltage command or the current command of the battery, wherein in the controlling of the output, an operation of the DC-DC converter is controlled to compensate for an error between a summed value obtained by summing the control value and the voltage command of the DC-DC converter and an output voltage detection value of the DC-DC converter.

4. The method of claim 3, wherein the controller includes:

a battery manager configured to monitor the detection voltage or the detection current of the battery; and a DC-DC conversion controller configured to receive the detection voltage or the detection current from the battery manager, generate the control value for compensating for the error between the voltage command or the current command of the battery and the detection voltage or the detection current of the battery, control the output of the DC-DC converter by applying the control value, and diagnose the connection status between the DC-DC converter and the battery based on a change in error between the detection voltage or the detection current of the battery and the voltage command or the current command of the battery.

5. The method of claim 3, wherein in the controlling of the output, a pulse width modulation signal controlling the operation of the DC-DC converter is generated to compensate for an error between a voltage command compensation value of the DC-DC converter and the output voltage detection value of the DC-DC converter.

6. A non-transitory computer readable medium containing program instructions executed by a processor, the computer readable medium comprising:

program instructions that generate a control value for compensating for an error between a voltage command or a current command of a battery and a detection voltage or a detection current of the battery;

program instructions that control an output of a DC-DC converter by applying the control value and control the DC-DC converter to compensate for an error between a summed value obtained by summing the control value and the voltage command of the DC-DC converter and an output voltage detection value of the DC-DC converter; and program instructions that diagnose an electrical connection status between the DC-DC converter and the battery based on a change in error between the detection voltage or the detection current of the battery and the voltage command or the current command of the battery.

* * * * *